United States Patent
Ha et al.

(10) Patent No.: US 7,378,698 B2
(45) Date of Patent: May 27, 2008

(54) MAGNETIC TUNNEL JUNCTION AND MEMORY DEVICE INCLUDING THE SAME

(75) Inventors: Young-Ki Ha, SuWon (KR); Jang-Eun Lee, SuWon (KR); Hyun-Jo Kim, Hwasung (KR); Jun-Soo Bae, Hwasung (KR); In-Gyu Baek, Seoul (KR); Se-Chung Oh, Yongin (KR)

(73) Assignee: Samsung Electronics Co., Ltd., Suwon, Gyeonggi-do (KR)

( * ) Notice: Subject to any disclaimer, the term of this patent is extended or adjusted under 35 U.S.C. 154(b) by 289 days.

(21) Appl. No.: 10/851,387

(22) Filed: May 24, 2004

(65) Prior Publication Data

US 2005/0035383 A1 Feb. 17, 2005

(30) Foreign Application Priority Data

Aug. 12, 2003 (KR) .................. 10-2003-0055895

(51) Int. Cl.
*H01L 29/76* (2006.01)
*H01L 29/94* (2006.01)
*H01L 31/062* (2006.01)
*H01L 31/113* (2006.01)
*H01L 31/119* (2006.01)

(52) U.S. Cl. ............... 257/295; 257/295; 257/E27.005; 257/E43.004; 257/E21.665; 365/32; 365/33; 365/50; 365/55; 365/66; 365/74; 365/80; 365/97; 365/130; 365/131; 365/171

(58) Field of Classification Search ............... 257/421, 257/E27.006, E27.005, E43.004, E21.665, 257/295; 428/692; 360/324.1; 365/158, 365/185.18, 173, 171, 32, 33, 50, 55, 66, 365/74, 80, 97, 130, 131

See application file for complete search history.

(56) References Cited

U.S. PATENT DOCUMENTS

| | | | | |
|---|---|---|---|---|
| 5,955,211 | A * | 9/1999 | Maeda et al. ............ | 428/811.2 |
| 6,181,537 | B1 * | 1/2001 | Gill ........................ | 360/324.2 |
| 6,400,536 | B1 * | 6/2002 | Gill ....................... | 360/324.12 |
| 6,549,454 | B1 | 4/2003 | Slaughter | |
| 6,649,960 | B1 * | 11/2003 | Cross ....................... | 257/296 |
| 6,784,509 | B2 * | 8/2004 | Yuasa et al. ............... | 257/421 |
| 6,791,806 | B1 * | 9/2004 | Gao et al. ............... | 360/324.2 |
| 6,826,078 | B2 * | 11/2004 | Nishiyama et al. ........ | 365/158 |
| 6,829,161 | B2 * | 12/2004 | Huai et al. .................. | 365/158 |
| 6,891,704 | B2 * | 5/2005 | Pinarbasi ................ | 360/324.2 |
| 7,064,938 | B2 * | 6/2006 | Pinarbasi .............. | 360/324.12 |
| 7,262,064 | B2 * | 8/2007 | Ohba et al. ................... | 438/3 |
| 7,268,986 | B2 * | 9/2007 | Gill ........................ | 360/324.2 |
| 2002/0051380 | A1 * | 5/2002 | Kamiguchi et al. ........ | 365/158 |
| 2003/0011463 | A1 | 1/2003 | Iwasaki et al. | |

(Continued)

FOREIGN PATENT DOCUMENTS

DE  102 48 271 A 1  10/2002

(Continued)

*Primary Examiner*—Steven Loke
*Assistant Examiner*—Tram H Nguyen
(74) *Attorney, Agent, or Firm*—Volentine & Whitt, PLLC

(57) ABSTRACT

A magnetic tunnel junction device includes a magnetically programmable free magnetic layer. The free magnetic layer includes a lamination of at least two ferromagnetic layers and at least one intermediate layer interposed between the at least two ferromagnetic layers.

8 Claims, 15 Drawing Sheets

U.S. PATENT DOCUMENTS

| | | | |
|---|---|---|---|
| 2003/0011942 A1* | 1/2003 | Pinarbasi ................ | 360/324.1 |
| 2003/0011944 A1* | 1/2003 | Hosomi .................. | 360/324.1 |
| 2003/0011945 A1* | 1/2003 | Yuasa et al. ............ | 360/324.1 |
| 2003/0062975 A1* | 4/2003 | Kishi et al. ............. | 335/106 |
| 2003/0062981 A1 | 4/2003 | Hosomi et al. | |
| 2003/0123197 A1* | 7/2003 | Mizuguchi et al. ........ | 360/313 |
| 2003/0128483 A1* | 7/2003 | Kamijo ................. | 360/324.11 |
| 2003/0184924 A1* | 10/2003 | Shimazawa et al. ..... | 360/324.1 |
| 2003/0185046 A1* | 10/2003 | Nishiyama et al. ........ | 365/158 |
| 2004/0001358 A1* | 1/2004 | Nahas et al. ........... | 365/185.18 |
| 2004/0032318 A1 | 2/2004 | Mori et al. | |
| 2005/0018361 A1* | 1/2005 | Gill ....................... | 360/324.1 |
| 2005/0052788 A1* | 3/2005 | Kamiguchi et al. ...... | 360/324.1 |
| 2005/0152183 A1* | 7/2005 | Nahas et al. ............. | 365/171 |
| 2005/0185454 A1* | 8/2005 | Brown et al. ............. | 365/171 |
| 2005/0243476 A1* | 11/2005 | Gill ....................... | 360/324.11 |
| 2006/0268469 A1* | 11/2006 | Sato et al. ............... | 360/324 |

FOREIGN PATENT DOCUMENTS

| | | |
|---|---|---|
| EP | 1 182 713 A2 | 2/2002 |
| EP | 1 310 944 A2 | 5/2003 |
| EP | 1 105 743 B1 | 12/2005 |
| WO | WO 01/67460 A1 | 9/2001 |

* cited by examiner

MAGNETIC TUNNEL JUNCTION AND MEMORY DEVICE INCLUDING THE SAME

BACKGROUND OF THE INVENTION

1. Field of the Invention

The present invention generally relates to magnetic random access memory (MRAM) devices, and more particularly, the present invention relates to MRAM devices having multi-laminated free magnetic layers, and to methods of fabricating MRAM devices having multi-laminated free magnetic layers.

2. Description of the Related Art

A magnetic random access memory (MRAM) device is a non-volatile memory in which data is stored by programming a magnetic tunnel junction (MTJ). The MTJ is capable of selectively transitioning between two magnetic orientations. The differing resistance values of the two orientations are used to distinguish logic values of the memory cells.

FIG. 1 is a simplified schematic view of an MTJ in each of a low resistance logic "0" magnetic state and a high resistance logic "1" magnetic state. In the figure, reference number 101 denotes a free magnetic layer made of a ferromagnetic material, reference number 102 denotes a tunneling barrier layer, reference number 103 denotes a pinned magnetic layer made of a ferromagnetic material, and reference number 104 denotes a pinning layer made of an anti-ferromagnetic material.

As depicted by the arrows of FIG. 1, the magnetic orientation of the ferromagnetic pinned layer 103 is fixed. This condition may be achieved during manufacture by contacting the anti-ferromagnetic pinning layer 104 with the pinned layer 103 and conducting a heat treatment (at about 200° C. to 300° C.). By application of the magnetic field of the pinning layer 104 during heat treatment, the magnetic spins of the pinned layer 103 become fixed and do not rotate upon later exposure to an external magnetic field. As such, as shown in FIG. 1, the magnetic moment of the pinned layer 103 is fixed in one direction (to the right in FIG. 1). In contrast, with the tunnel barrier layer 102 sandwiched between the pinned magnetic layer 103 and the free magnetic layer 101, the magnetic orientation of the free magnetic layer 101 remains unfixed. As such, the magnetic spins of the free magnetic layer 101 are free to rotate upon later exposure to an external magnetic field. In the MTJ of an MRAM, the free magnetic layer 101 may be stably oriented in one of two directions, i.e., one with its moment parallel to that of the pinned magnetic layer 103, and the other with its moment opposite that of the pinned magnetic layer 103.

As shown in FIG. 1, when the moments of the pinned layer 103 and the free magnetic layer 101 are parallel to one another, the MTJ exhibits a low resistance which may be designated a logic "0" state. In contrast, when the moments extend in opposite directions, the MTJ has a high resistance which may be designated a logic "1" state.

FIG. 2 is a more detailed view of the conventional MTJ. In this cross-sectional view, reference number 1 denotes the pinning layer, reference number 8 denotes the pinned magnetic layer, reference number 9 denotes the tunneling barrier layer, and reference number 14 denotes the free magnetic layer.

As mentioned above, the pinning layer 1 is formed of an anti-ferromagnetic material. Examples include PtMn, IrMn and FeMn.

The pinned magnetic layer 8 is constituted by three layers, i.e., a lower ferromagnetic layer 3, a metal layer 5, and an upper ferromagnetic layer 7. An example of the upper and lower ferromagnetic layers 3 and 7 is CoFe, and an example of the metal layer 5 is Ru.

The tunneling barrier layer 9 is an insulator, and an example thereof is $Al_2O_3$.

The free magnetic layer 14 is a two layer structure consisting of a thin lower ferromagnetic layer 11 and a thick upper ferromagnetic layer 13. An example of the thin lower ferromagnetic layer 11 is CoFe, and an example of the thick upper ferromagnetic layer is NiFe.

FIGS. 3(A) and 3(B) illustrate a conventional MRAM memory cell, where FIG. 3(B) is a cross-sectional view taken along line I-I' of FIG. 3(A).

Referring first to FIG. 3(B), the memory cell includes an MTJ 36, such as that shown in FIG. 2, sandwiched between upper and lower electrodes 37 and 27. The MTJ 36 includes a pinning layer 29 contacting the lower electrode 27, a pinned magnetic layer 31, a tunneling barrier layer 33, and a free magnetic layer 35 contacting the upper electrode 37. The MTJ 36, the upper electrode 37 and the lower electrode 27 together define a programmable magneto-resistive element MR.

The upper electrode 37 contacts a bit line BL extending orthogonally relative to the magnetic orientations of the MTJ 36. In this example, the bit line BL extends into and out of the plane of FIG. 3(B).

A digit line DL is spaced from the bottom of the bottom electrode 27 with an inter-layer dielectric 25 interposed there between. The digit line DL extends parallel to the magnetic orientations of the MTJ 36, and in this example, the digit line DL extends left to right in the diagram of FIG. 3(B).

The digit line DL may be formed over an inter-layer dielectric 23, which in turn may be formed over a substrate 21.

FIG. 3(A) is a top view showing the configuration of the bit line BL and the digit line DL, as well as an outline of the periphery of the magneto-resistive element MR. As shown, the top profile of the magneto-resistive element MR is substantially rectangular, with a length L exceeding a width W. The bit line BL carries a bit line current IBL, and extends length-wise along the width W of the magneto-resistive element MR. Further, the bit line BL is wide enough to substantially overlap the length L of the magneto-resistive element MR. The digit line DL extends orthogonally to the bit line BL, along the length L of the magneto-resistive element MR. Further, the digit line DL is wide enough to substantially overlap the width W of the magneto-resistive element MR.

As shown in FIG. 3(A), a hard magnetic axis Hhard extends in the direction of the shorter width W, and an easy magnetic axis Heasy extends in the direction of the longer length L.

FIG. 4 illustrates a conventional MRAM array which includes a plurality of intersecting bit lines BL1, BL2, ..., BLn, and digit lines DL1, DL2, ..., DLn. Write current ID is applied to each digit line, and write current IB is applied to each bit line. Magneto-resistive elements MR12, MR22, ..., MRn2 are located along the bit lines at the intersections with the digit lines.

FIG. 5(A) is a cross-sectional schematic view of an MRAM cell including a transistor for reading a logic state of the cell, and FIG. 5(B) is a circuit representation of the same. A magneto-resistive element MR1 is configured like that shown in FIG. 3(B) and includes an upper electrode 77, a lower electrode 55, and an MTJ 75 sandwiched between the upper electrode 77 and the lower electrode 55. The MTJ 75 includes a pinning layer 57, a pinned magnetic layer 64, an insulating barrier layer 65, and a free magnetic layer 73.

Reference numbers 53a, 53b, 53c and 111 denote interlayer dielectric layers (ILDs). A bit line BL is connected to the upper electrode 73 of the magneto-resistive element MR1 and is located on a top surface of the ILD 111. A digit line DL extends orthogonally to the bit line BL on an upper surface of the ILD 53b and below the magneto-resistive element MR1.

A transistor TA is defined by a word line (gate) WL, a source S and a drain D. The source S and drain D are formed in a substrate 51. The source S is connected to a source pad 103S via a contact plug 101s. The drain D is connected to the lower electrode 55 via upper and lower drain pads 107, 103d, and contact plugs 109, 105 and 101d.

A read operation is executed when a signal on the word line WL is sufficient to render the transistor TA in a conductive state. Current then flows from the bit line BL through the magneto-resistive element MR1. When the magneto-resistive element MR1 is programmed in a low resistance state (logic "0"), a relatively large amount of current will flow through the transistor TA. When the magneto-resistive element MR1 is programmed in a high resistance state (logic "1"), a relatively small amount of current will flow through the transistor TA. Thus, the amount of current flow can be used to determine the programmed state of the magneto-resistive element.

The sensing margin of the magneto-resistive element is defined by the difference or ratio between the high resistive state Rmax and low resistance state Rmin of the magneto-resistive element MR1. Unfortunately, however, magnetic imperfections in the free magnetic layer of the MTJ adversely impact the sensing margin.

FIG. 6(A) depicts a free magnetic layer 14 having an external magnetic field H applied thereto. Each of the encircled areas denotes a domain of the free magnetic layer 14. Upon application of the external magnetic field H, the magnetized direction of each domain should be parallel to the magnetic field H. However, as can be seen in FIG. 6(A), some of the magnetized directions are not parallel to the field H, particularly at the domain boundary. This reduces the sensing margin. Accordingly, to overcome the non-parallel moments at the domain boundaries, it becomes necessary to strengthen the magnetic field H by increasing the currents applied to the bit line and digit line. The result is increased power consumption.

As shown at the right side of FIG. 6(B), the free magnetic layer is ideally formed of uniformly arranged grains. However, has shown by the enlarged view at the left side of FIG. 6(B), thick ferromagnetic layers exhibit large and irregular grains. The result is many domain boundaries that degrade magnetization uniformity.

FIG. 7 is a hysteresis loop for explaining the effects of magnetic imperfections in the MTJ. The solid lined portion is the hysteresis loop for an ideal MTJ, and the dashed line to the right shows a loop characteristic of a conventional MRAM.

As shown, in the case of an ideal MTJ, when the magnetic flux Heasy is +H1 (Oe), the magnetic moment of the free magnetic layer completely rotates in one direction and the MTJ resistance Rw (Ω) goes from Rmin to Rmax. On the other hand, when the magnetic flux Heasy becomes –H1 (Oe), the magnetic moment rotates in the other direction and the MTJ resistance Rw goes from Rmax to Rmin. Also, so long as the magnetic flux Heasy is greater than –H1 and less than +H1, there is no change in the MTJ resistance Rw.

The conventional MRAM, however, does not operate ideally, and instead the MTJ resistance Rw only begins to increase at "k" when the magnetic flux becomes +H1. The rotation of the magnetic moment of the free magnetic layer is gradual, and accordingly, the MTJ resistance Rw gradually increases with an increase in the magnetic flux Heasy. In order to achieve Rmax, an increased magnetic flux of +H1' is needed, which means additional power must be consumed.

Incidentally, as mentioned previously, the conventional free magnetic layer consists of a lower layer of CoFe, and an upper layer of NiFe. The CoFe layer is provided to increase the sensing margin, i.e., the difference between Rmax and Rmin in FIG. 7. On the other hand, the NiFe layer is intended to decrease the width Q of the hysteresis loop of FIG. 7, which would mean less power consumption.

FIG. 8(A) shows the switching characteristic of an ideal MTJ in relation to the application of the magnetic flux Heasy and the magnetic flux Hhard. A write is achieved when the magnetic flux Heasy is HME (Oe), or when the magnetic flux Hhard is HMH (Oe). In addition, the curved lines BDL in each quadrant denote the minimum combination of Heasy and Hhard to write the MTJ, i.e., to switch the direction of the moment of the free magnetic layer of the MTJ. Thus, a write region WR is located outside the curved lines BDL, and a read region RR is located within the curved lines BDL. The ideal MTJ can be reliable written at point P1, where a magnetic flux Heasy is 20 Oe and the magnetic flux Hhard is 20 Oe.

For comparison with the ideal MTJ, FIG. 8(B) shows the switching characteristics of the conventional MTJ. As shown, the ideal write flux P2 (Heasy=Hhard=20 Oe) will not in most instances switch the magnetic moment of the free magnetic layer of the conventional MTJ. Rather, a magnetic flux where both Hheasy and Hhard are about 40 Oe is needed to reliably write the MTJ.

Further, as shown in FIG. 8(B), the conventional MTJ is characterized by a wide write variation 1W. This can be modeled as two ideal MTJs as shown in FIG. 9, wherein an inner MTJ1 corresponds to the inner boundary of the write variation 1W, and the outer MTJ2 corresponds to the outer boundary of the write variation 1W. In order to reliably write the outer MTJ2, a write flux such as that shown at point P3 is needed. However, such a write flux is well in excess of both HME' and HMH' of the inner transistor MTJ1. This can cause write errors with respect to the inner transistor MTJ1.

In summary, magnetic imperfections in the conventional magnetic tunnel junction can result in both increased power consumption and operational faults.

SUMMARY OF THE INVENTION

According to a first aspect of the present invention, a magnetic tunnel junction device is provided which includes a magnetically programmable free magnetic layer, where the free magnetic layer includes a lamination of at least two ferromagnetic layers and at least one intermediate layer interposed between the at least two ferromagnetic layers.

According to another aspect of the present invention, a magnetic tunnel junction device is provided which includes an anti-ferromagnetic pinning layer, a tunneling layer, a ferromagnetic pinned layer located between the anti-ferromagnetic pinning layer and the tunneling layer, and a free magnetic layer. The free magnetic layer includes a lamination of at least two ferromagnetic layers and at least one intermediate layer interposed between the at least two ferromagnetic layers.

According to still another aspect of the present invention, a memory device is provided which includes a first conductive line extending lengthwise in a first direction and located over a substrate, and a second conductive line extending lengthwise in a second direction which traverses the first direction, the second conductive line overlapping the first conductive line to define an overlapping region there between. The memory device further includes a magnetic tunnel junction device located in the overlapping region between the first and second conductive lines. The magnetic tunnel junction device has a magnetically programmable free magnetic layer located between a first electrode and a second electrode, and the free magnetic layer includes a lamination of at least two ferromagnetic layers and at least one intermediate layer interposed between the at least two ferromagnetic layers. The memory device also includes a transistor including a gate electrode and first and second source/drain regions, wherein the first source/drain region is electrically connected to the first electrode of the magnetic tunnel junction device.

According to another aspect of the present invention, a magnetic tunnel junction device is provided which includes a magnetically programmable free magnetic layer, where the free magnetic layer includes a lamination of at least three material layers.

BRIEF DESCRIPTION OF THE DRAWINGS

The above and other aspects and features of the present invention will become readily apparent from the detailed description that follows, with reference to the accompanying drawings, in which:

FIG. 3(B) is a cross-sectional view taken along line I-I' of FIG. 3(A);

DETAILED DESCRIPTION OF THE PREFERRED EMBODIMENTS

The present invention will now be described in detail below with reference to several preferred but non-limiting embodiments.

Figures 10A, 10B:
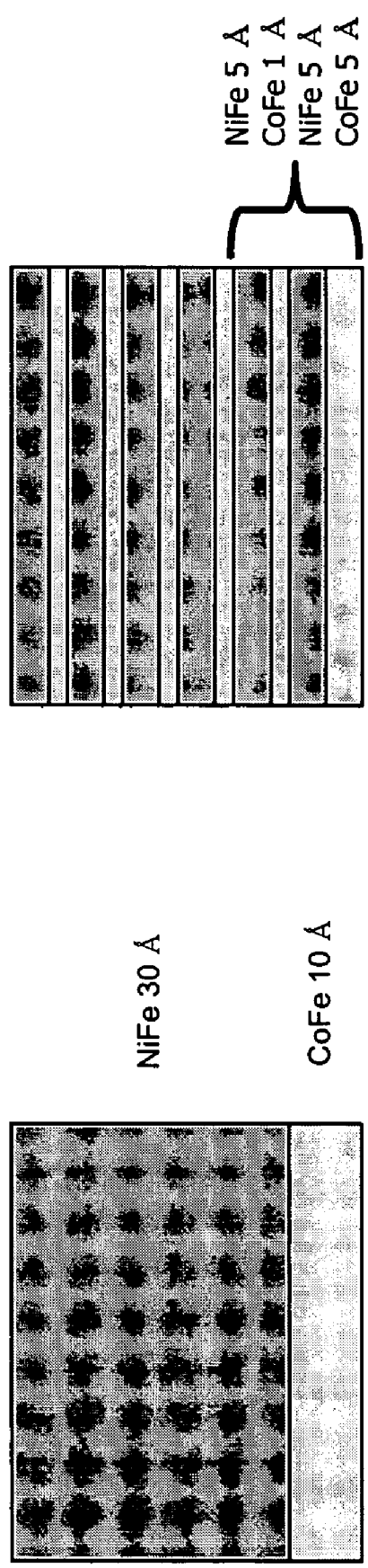
FIG. 10(A) is a schematic cross-sectional view of a conventional free magnetic layer of an MTJ.
FIG. 10(B) is a schematic cross-sectional view of a free magnetic layer according to an embodiment of the present invention.

The present invention is at least partially characterized by a magnetic tunnel junction (MTJ) containing a multi-laminated free magnetic layer. Attention is directed to FIGS. 10(A) and 10(B) showing a comparison between the conventional free magnetic layer and the multi-laminated free magnetic layer of an embodiment of the present invention.

As shown in FIG. 10(A), the conventional free magnetic layer consists of a layer of NiFe stacked on a layer of CoFe. These layers are relatively thick. For example, the CoFe layer is about 10 Å thick, and the NiFe layer is about 30 Å thick, resulting in a total free magnetic layer thickness of about 40 Å. As explained previously, these thick layers of the MTJ, particularly the NiFe layer, contain large and irregular grains which form many domain boundaries that degrade magnetization uniformity.

In contrast, as shown in FIG. 10(B), the multi-laminated free magnetic layer of the illustrated embodiment contains multiple and alternating thin layers CoFe and NiFe. The bottommost layer of CoFe has a thickness of about 5 Å, and the remaining layers of CoFe have a thickness of about 1 Å. Each of the layers of NiFe have a thickness of about 5 Å. Here, the total thickness of 40 Å is the same as that of the conventional free magnetic layer. The laminate structure of the embodiment prevents grain growth during lower-power sputter deposition of the thin layers. The resultant small grain size minimizes the number of domains of each layer, or reduces each layer to a single domain. Since the number of domain boundaries is reduced, the magnetic characteristics of the free magnetic layer are improved as will be demonstrated later.

Figure 11:
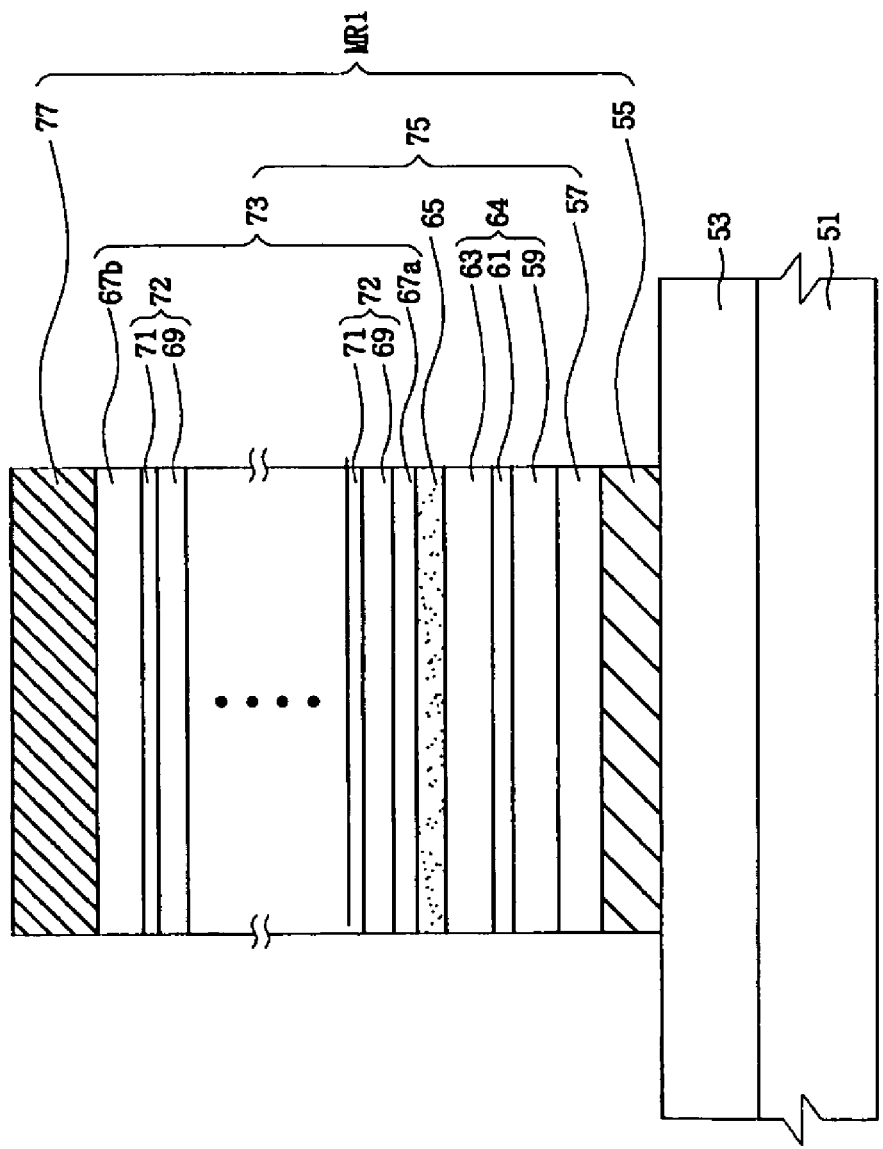
FIG. 11 is a schematic cross-sectional view of an MTJ according to an embodiment of the present invention.

FIG. 11 is a schematic cross-sectional view of a magnetic tunnel junction device containing a multi-laminated free magnetic layer according to an embodiment of the present invention. As shown, the device of this example includes a magneto-resistive element 51 located over an interlayer dielectric (ILD) 53 and a substrate 51. The magneto-resistive element includes a magnetic tunnel junction 75 sandwiched between an upper electrode 77 and a lower electrode 55.

The magnetic tunnel junction 75 is a multi-layer structure including pinning layer 57 located over the lower electrode 55, a pinned layer 64 located over the pinning layer 57, an tunneling barrier layer 65 located over the pinned layer 64, a free magnetic layer 73 located over the insulating layer 65 and below the upper electrode 77.

The pinning layer 57 is formed of an anti-ferromagnetic layer. Examples include PtMn, IrMn, and FeMn.

The pinned magnetic layer 64 is constituted by three layers, i.e., a lower ferromagnetic layer 59, a metal layer 61, and an upper ferromagnetic layer 63. An example of the upper and lower ferromagnetic layers 59 and 63 is CoFe, and an example of the metal layer 61 is Ru.

The tunneling barrier layer 65 is an insulating layer, and an example thereof is $Al_2O_3$.

The free magnetic layer 73 is configured in the same manner as described above in connection with FIG. 10(B). That is, referring to FIG. 11, the free magnetic layer 73 includes a lowermost layer 67a of CoFe having a thickness of about 5 Å. Stacked above the layer 67a are multiple layers 67 and 71 of NiFe and CoFe, respectively. Each NiFe layer 67 has a thickness of about 5 Å, and each CoFe layer has a thickness of about 1 Å. In this embodiment, a total thickness of the free magnetic layer is about 40 Å.

Figure 1:
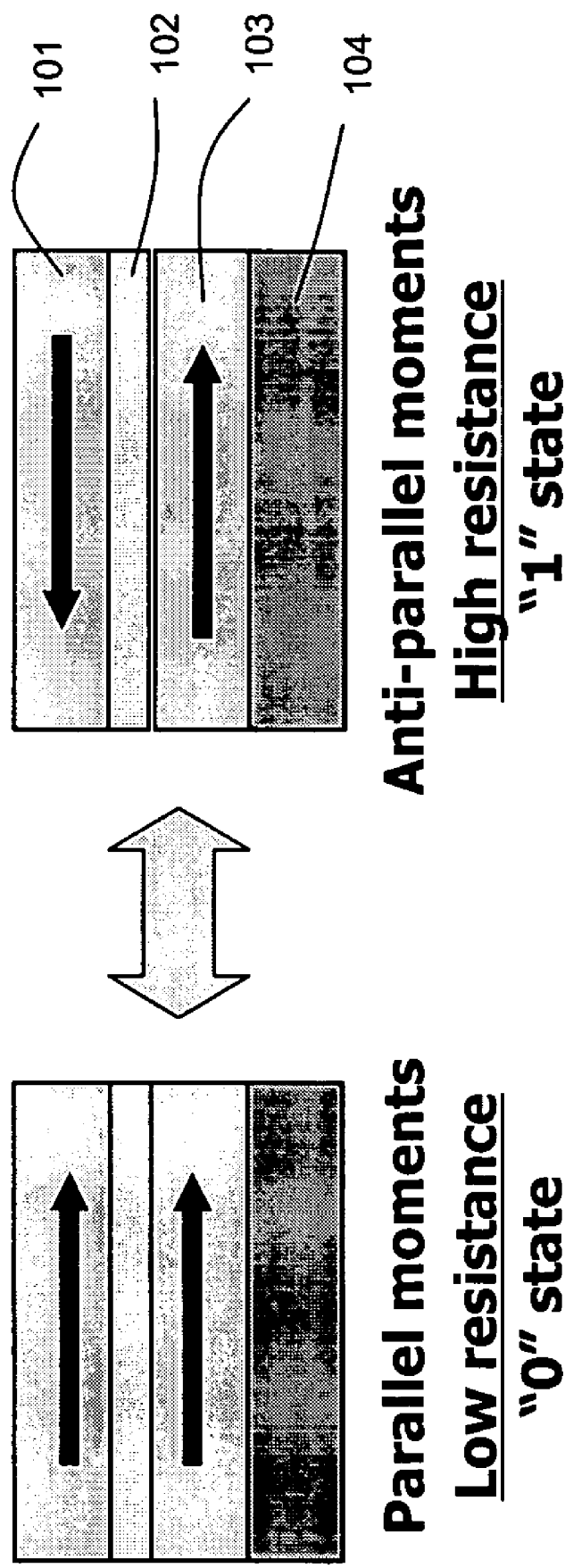
FIG. 1 is a simplified schematic view of a magnetic tunnel junction (MTJ) in each of a low resistance logic "0" magnetic state and a high resistance logic "1" magnetic state.
Figure 2:
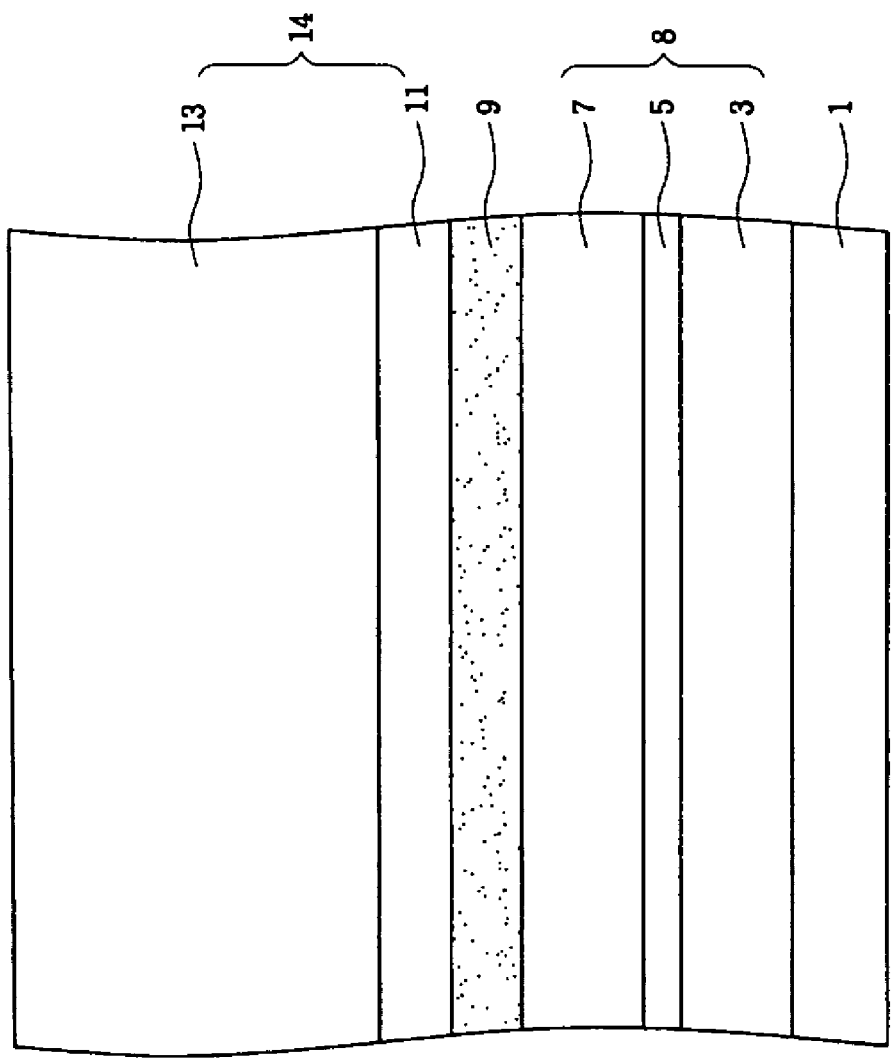
FIG. 2 is a more detailed view of the conventional MTJ.
Figures 3A, 3B:
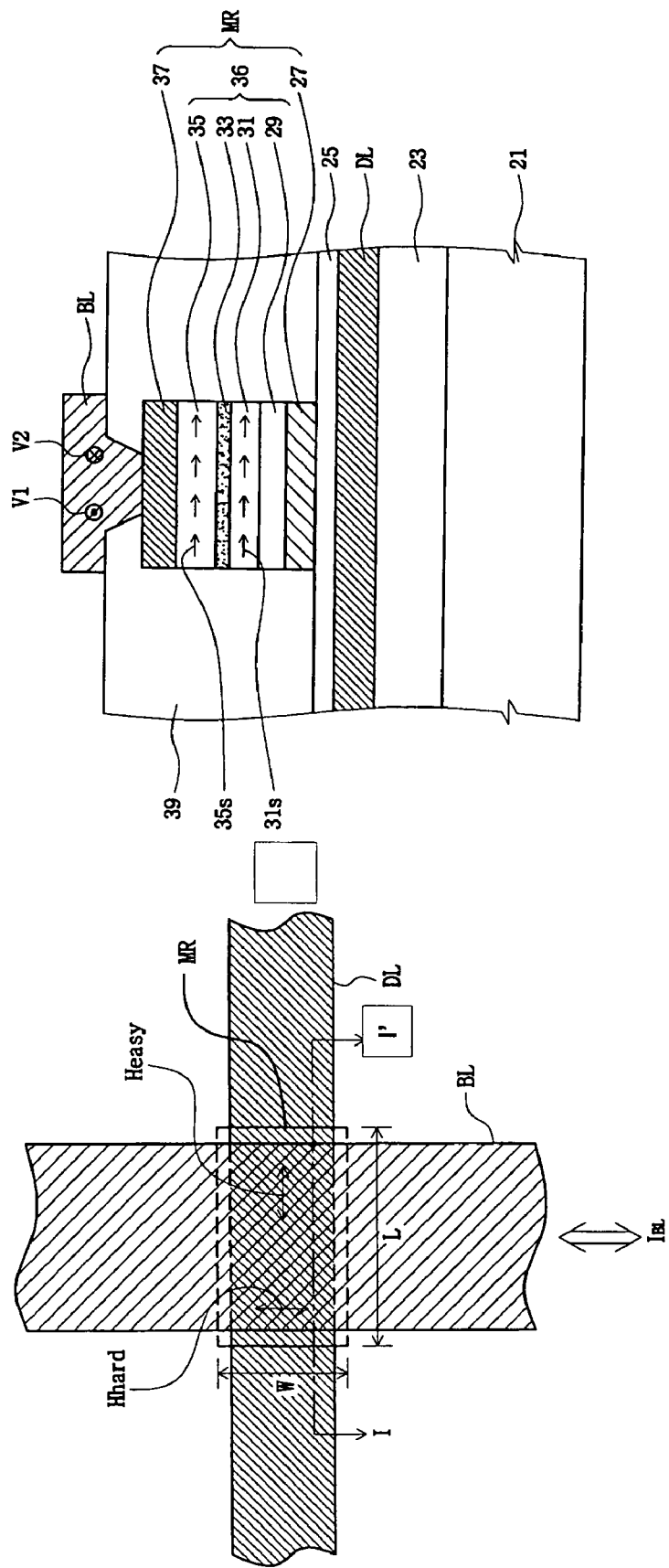
FIGS. 3(A) and 3(B) illustrate a conventional MRAM memory cell, where
Figure 4:
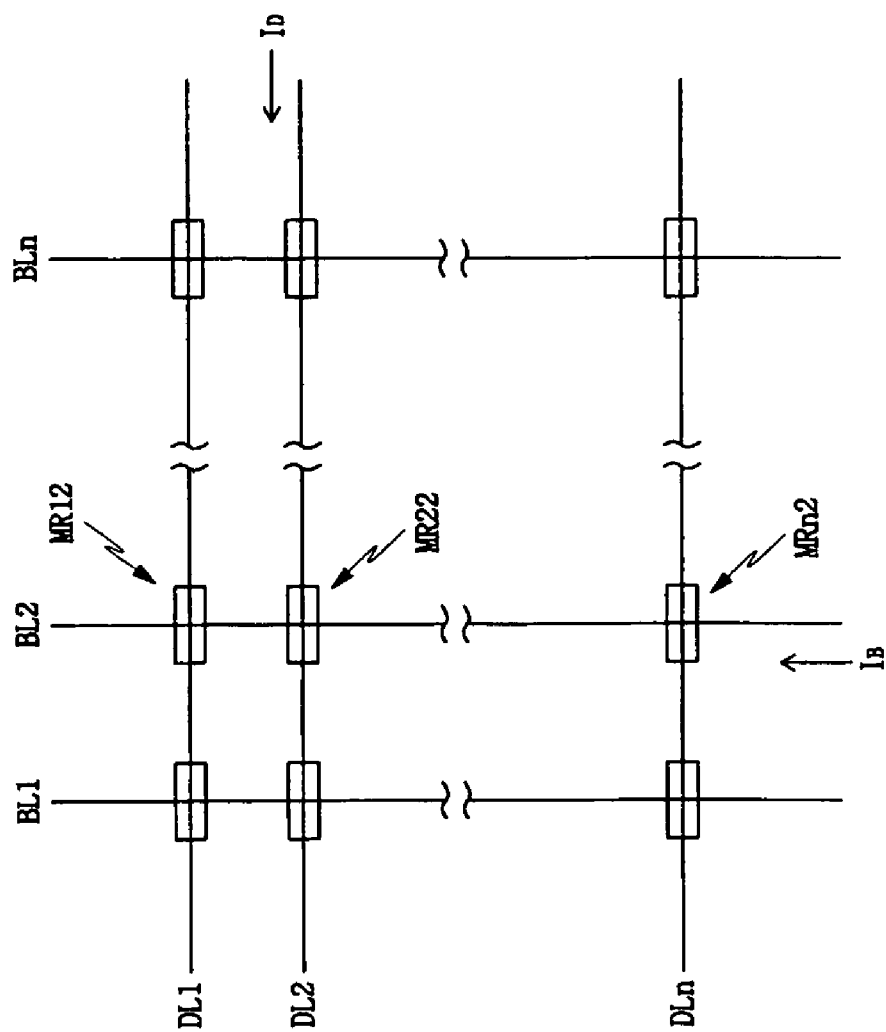
FIG. 4 illustrates a conventional MRAM array.
Figure 5B:
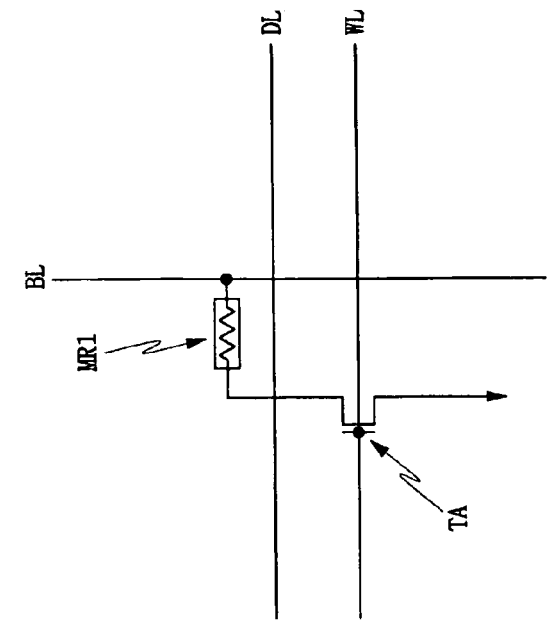
FIG. 5(B) is a circuit representation of the same.
Figure 5A:
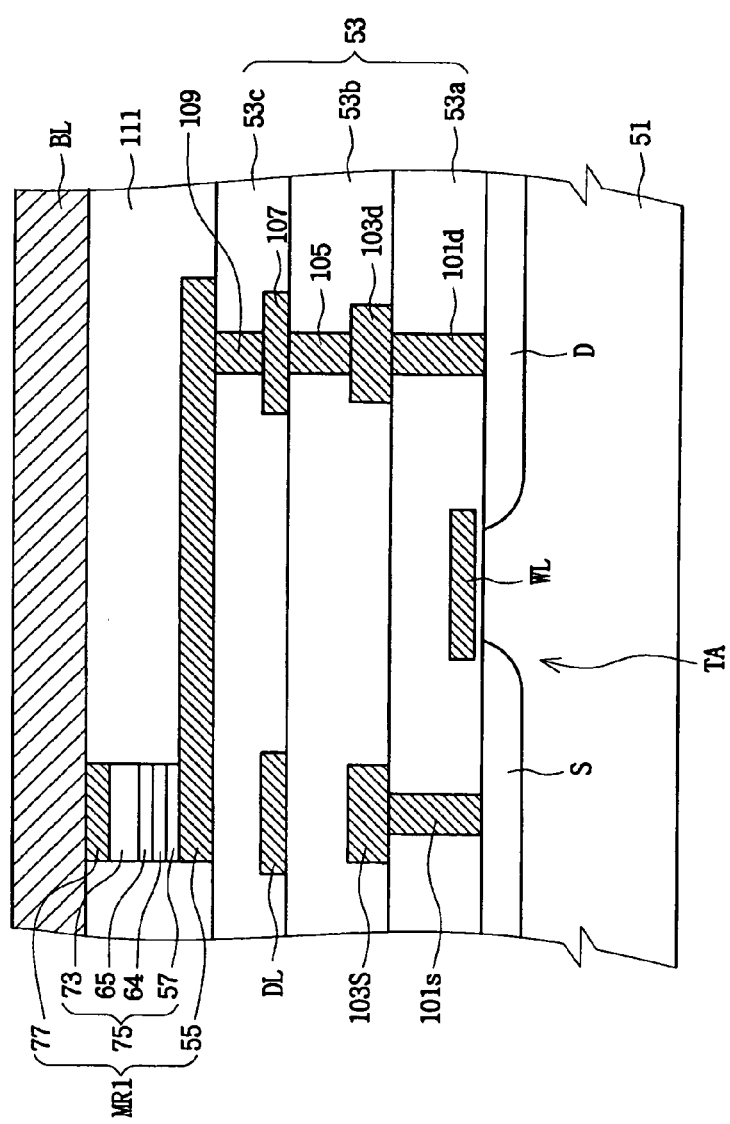
FIG. 5(A) is a cross-sectional schematic view of an MRAM cell including a transistor for reading a logic state of the cell.
Figure 6A:
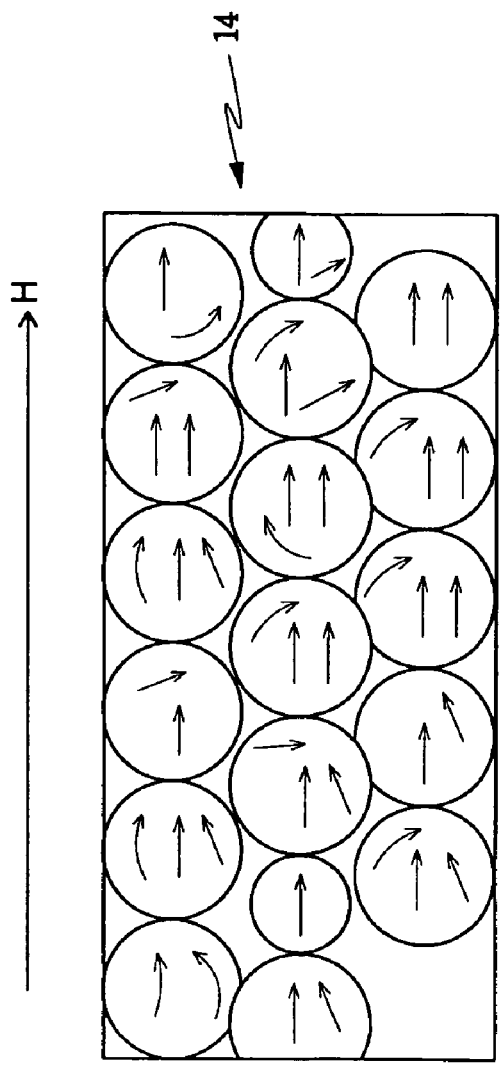
FIGS. 6(A) and 6(B) are schematic views of explaining the effects of domain boundaries in a magnetic free layer of an MTJ.
Figure 6B:
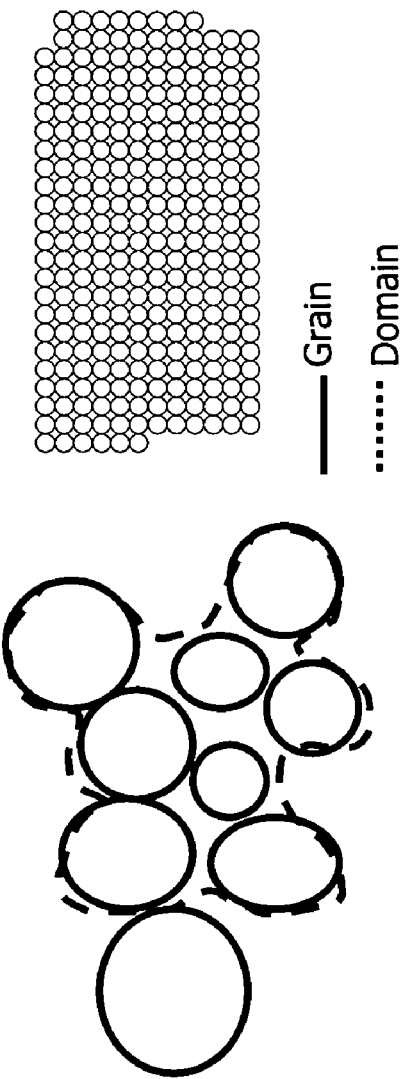
Figure 7:
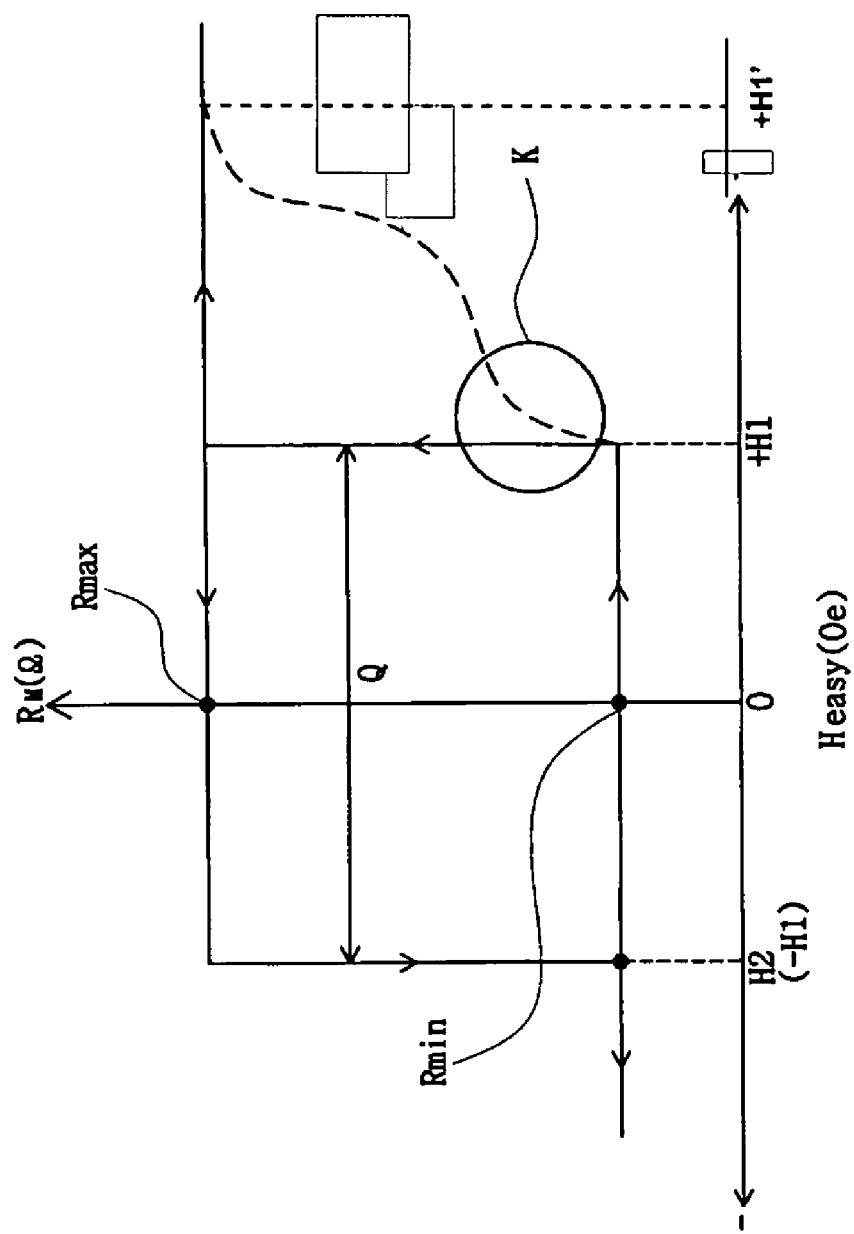
FIG. 7 is a hysteresis loop illustrating characteristics of an ideal MTJ and a conventional MTJ.
Figure 8B:
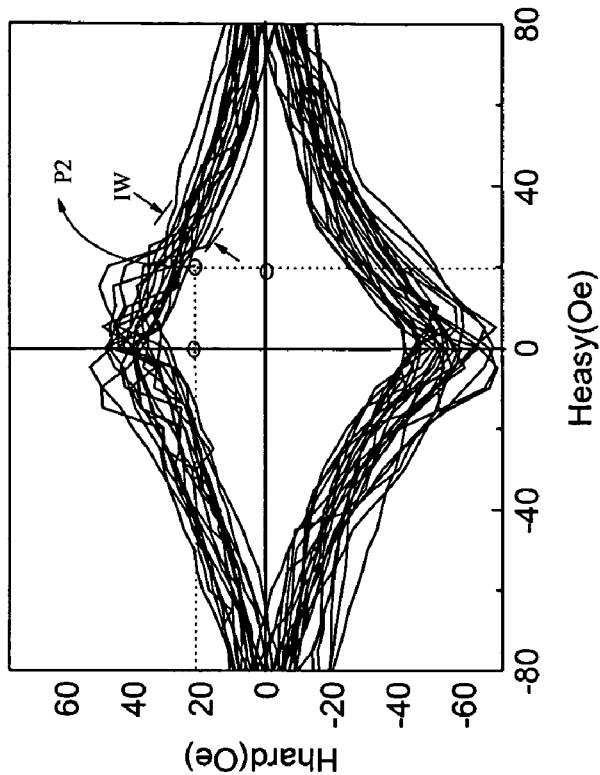
FIG. 8(B) shows a switching characteristic of a conventional MTJ.
Figure 8A:
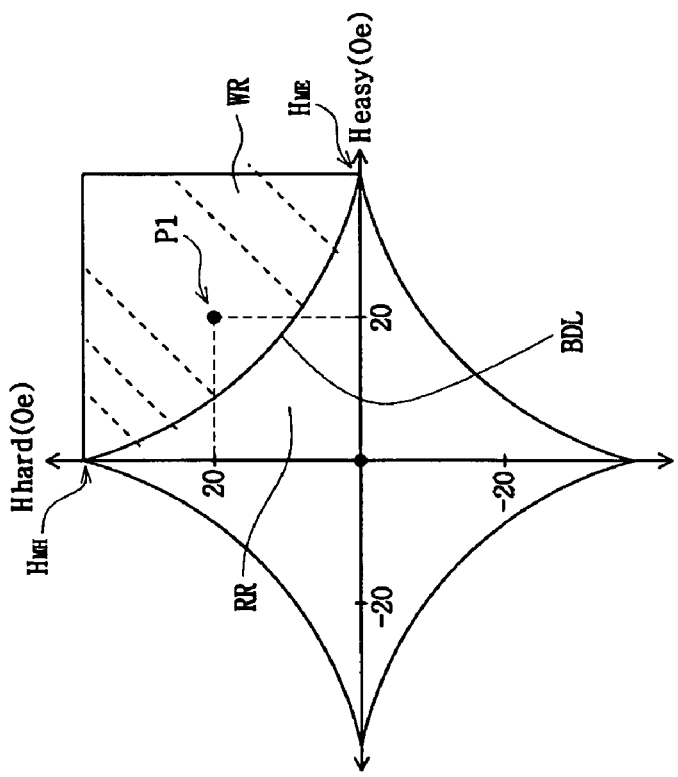
FIG. 8(A) shows a switching characteristic of an ideal MTJ.
Figure 9:
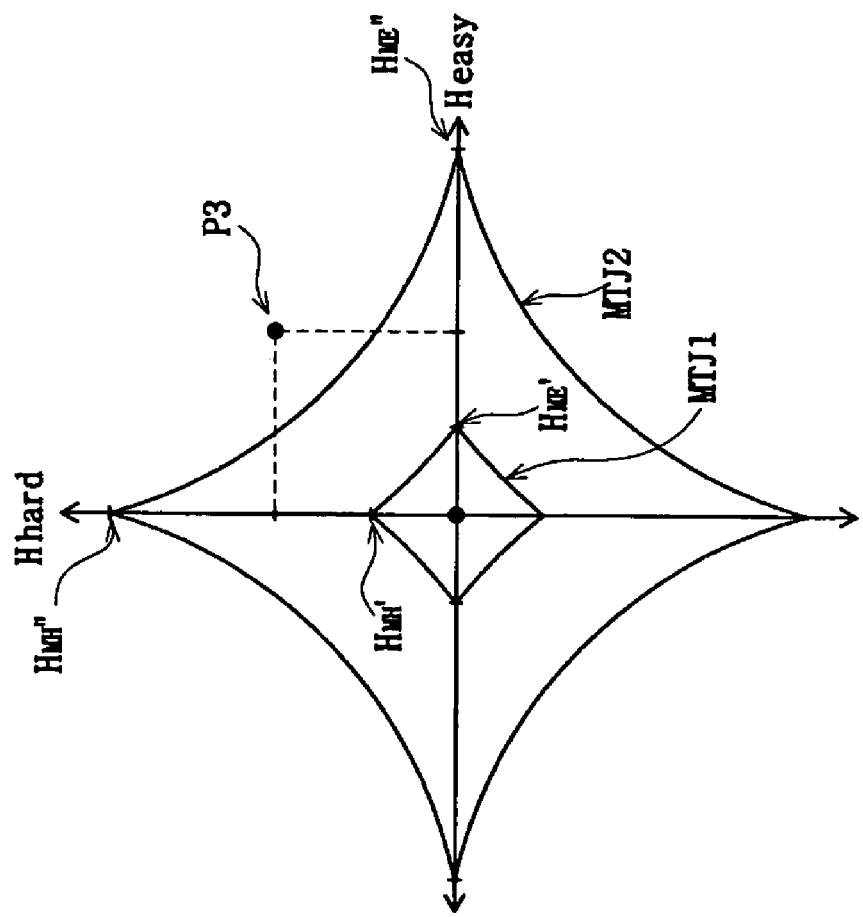
FIG. 9 shows a switching characteristic a conventional MTJ which has been modeled as two ideal MTJ's.
Figure 12:
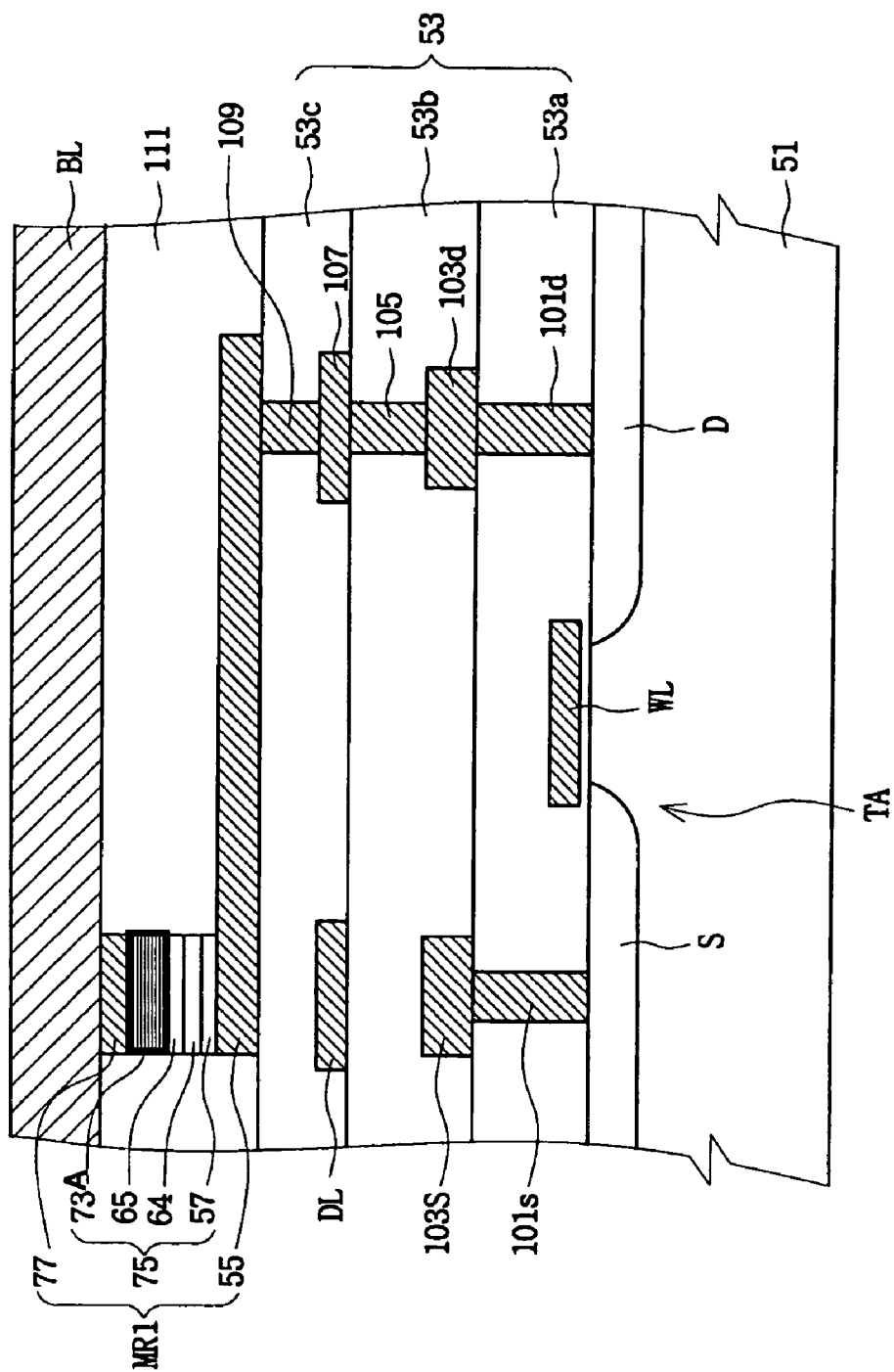
FIG. 12 is a schematic cross-sectional view of an MRAM cell according to an embodiment of the present invention.

FIG. 12 is a schematic cross-sectional view of an MRAM cell according to an embodiment of the present invention. The MRAM cell of this embodiment is structurally the same as that previously described in connection with FIG. 5(A), except that the MTJ 75 of FIG. 5(A) is replaced with the multi-laminated free magnetic layer 73A of embodiments of the present invention. For example, the multi-laminated free magnetic layer may be the same as that shown in FIG. 10(B). All other elements of FIG. 12 are the same as the like-numbered elements of FIG. 5(A), and a detailed description thereof is omitted here to avoid redundancy.

Figure 13:
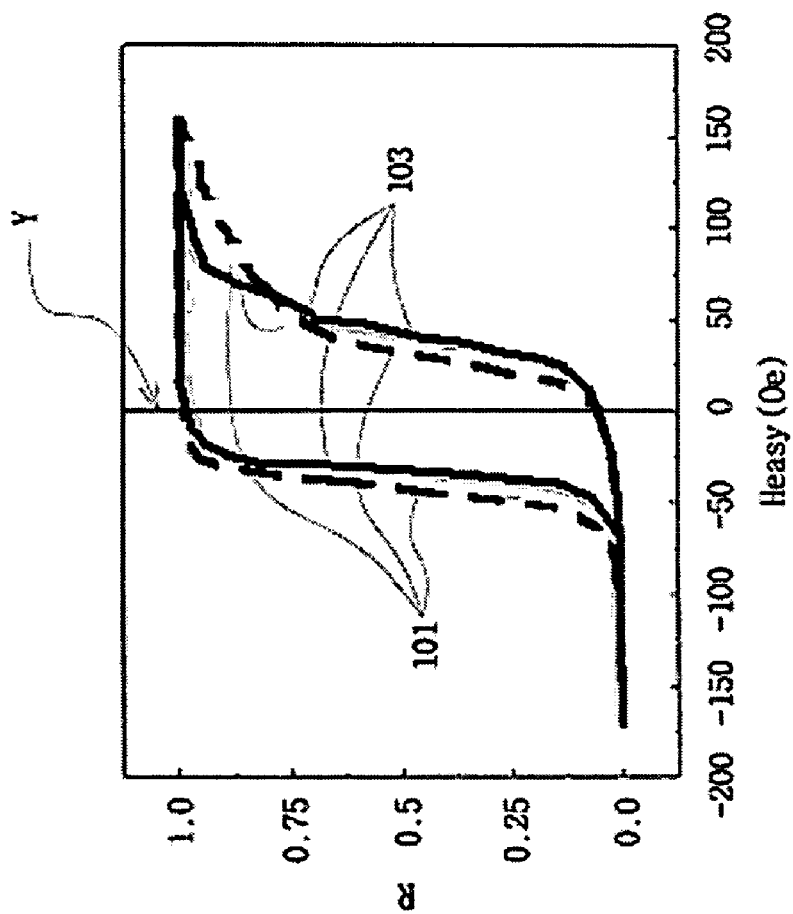
FIG. 13 shows a comparison between hysteresis loop characteristics of a conventional MTJ and hysteresis loop characteristics of an MTJ according to an embodiment of the present invention.

FIG. 13 illustrates measurement results of the average hysteresis loop of a sample of conventional MTJ structures (sample size was 100 ea) and a sample of MTJ structures (sample size was 100 ea) of an embodiment of present invention. In both sample sets, the same pinning layer configuration (CoFe 30 Å, Ru 8 Å, CoFe 34 Å) and tunneling barrier layer configuration (Al2O3 12 Å) were used. Also, the horizontal cross-section of each sample was the same (0.8 μm*0.4 μm).

The free magnetic layer of the tested conventional MTJ structures was composed of a layer of CoFe (10 Å) and a layer of NiFe (30 Å), with a total thickness of 40 Å. See FIG. 10(A).

The free magnetic layer of the tested MTJ of the present embodiment structures was a multi-laminated structure composed of a first layer of CoFe (5 Å), and then alternating layers of NiFe (5 Å) and CoFe(1 Å), with a total thickness of 40 Å. See FIG. 10(B).

The measurements were conducted without a hard magnetic field. The solid line 103 shows the average test results for the MTJ of the present embodiment, and the dashed line 101 shows the test results for the conventional MTJ. The MTJ resistance is normalized to 1.0 in the FIG. 13.

As is apparent from FIG. 13, the test results associated with the present embodiment exhibit better symmetry when compared to those of the conventional MTJ. Also, less magnetic flux, and therefore less power, is needed to achieve the maximum and minimum resistance values.

Figure 14B:
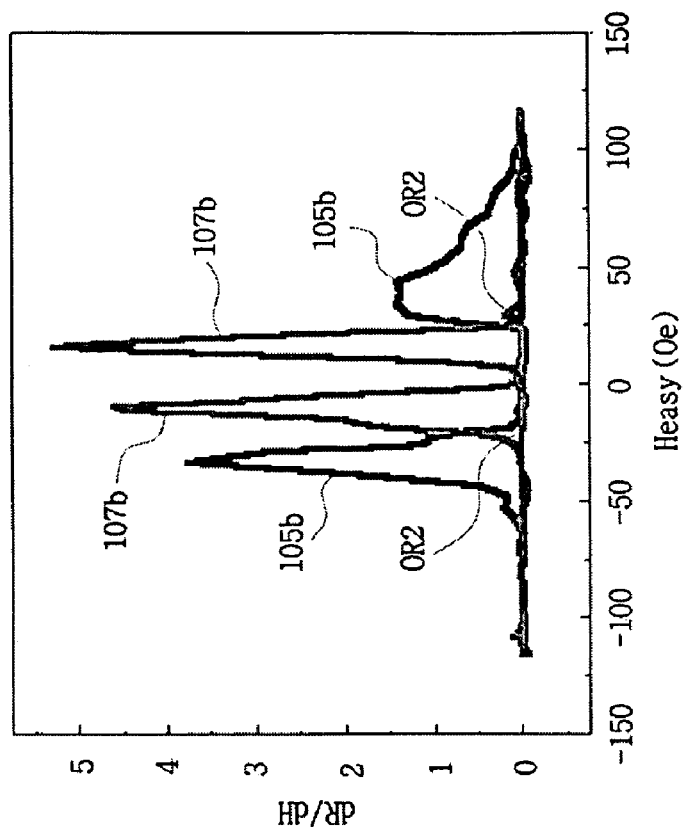
FIGS. 14(A) and 14(B) are graphs respectively showing the slopes the hysteresis loop characteristics of the conventional MTJ and the hysteresis loop characteristics of an MTJ according to an embodiment of the present invention.
Figure 14A:
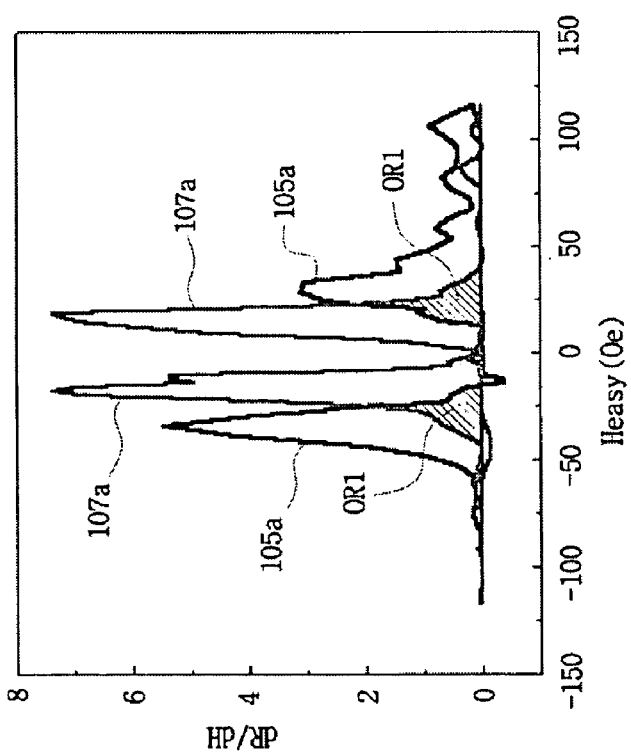

FIG. 14(A) shows the rate of change in resistance (dR/dH) relative to the change the magnetic flux Heasy of the conventional MTJ. The dark line 105a shows the case where there is no hard magnetic flux Hhard (i.e., Hhard=0 Oe). The gray line 107a shows the case where a hard magnetic flux of 30 Oe is present. As is apparent from FIG. 14(A), large overlap regions OR1 exists in which the magnetic spins of the free magnetic layer are rotated by the magnetic flux Heasy in the absence of the magnetic flux Hhard. The result is the increased incidence of write errors.

FIG. 14(B) shows the rate of change in resistance (dR/dH) relative to the change the magnetic flux Heasy of the MTJ of the embodiment of the present invention. The dark line 105b shows the case where there is no hard magnetic flux Hhard (i.e., Hhard=0 Oe). The gray line 107b shows the case where a hard magnetic flux of 30 Oe is present. As is apparent from FIG. 14(B), only minimal overlap regions OR2 exists in which the magnetic spins of the free magnetic layer are rotated by the magnetic flux Heasy in the absence of the magnetic flux Hhard. As such, in comparison to the conventional MTJ, the incidence of write errors is substantially reduced.

In the drawings and specification, there have been disclosed typical preferred embodiments of this invention and, although specific examples are set forth, they are used in a generic and descriptive sense only and not for purposes of limitation. For example, in the previous embodiment, the first CoFe layer has a thickness of about 5 Å, the remaining CoFe layers have a thickness of about 1 Å, the NiFe layers have a thickness of about 5 Å, and the total thickness of the free magnetic layer is about 40 Å. The invention is not limited to these thicknesses, nor is the invention limited to these materials. Further, the invention is not limited to the number of layers depicted in the previous embodiment. However, to minimize domain boundaries, it is preferable (but not required) that each layer of the free magnetic layer lamination have a thickness which is less than 10A. Also, attention is directed to FIG. 15 which illustrates several alternative embodiments of free magnetic layers 1501 through 1504 of the invention.

The free magnetic layer 1501 is composed of alternating ferromagnetic layers 1 and 2 as shown. As examples only, the ferromagnetic layer 1 is one of CoFe or NiFe, and the ferromagnetic layer 2 is the other of NiFe, with the ferromagnetic layer 1 being the lowermost layer.

The free magnetic layer 1502 is composed of alternating ferromagnetic layers 1 and amorphous ferromagnetic layers 3 as shown. As examples only, the ferromagnetic layer 1 is one of CoFe or NiFe, and the amorphous ferromagnetic layer 3 is CoFeB, with the ferromagnetic layer 1 being the lowermost layer.

The free layer 1503 is similar to the free magnetic layer 1502, except that the amorphous ferromagnetic 3 is the lowermost layer.

The free layer 1504 is composed of alternating ferromagnetic layers 1 and non-ferromagnetic layers 4 as shown. As examples only, the ferromagnetic layer 1 is one of CoFe or NiFe, and the non-ferromagnetic layer 4 is Ta, with the ferromagnetic layer 1 being the lowermost layer.

Figure 15:
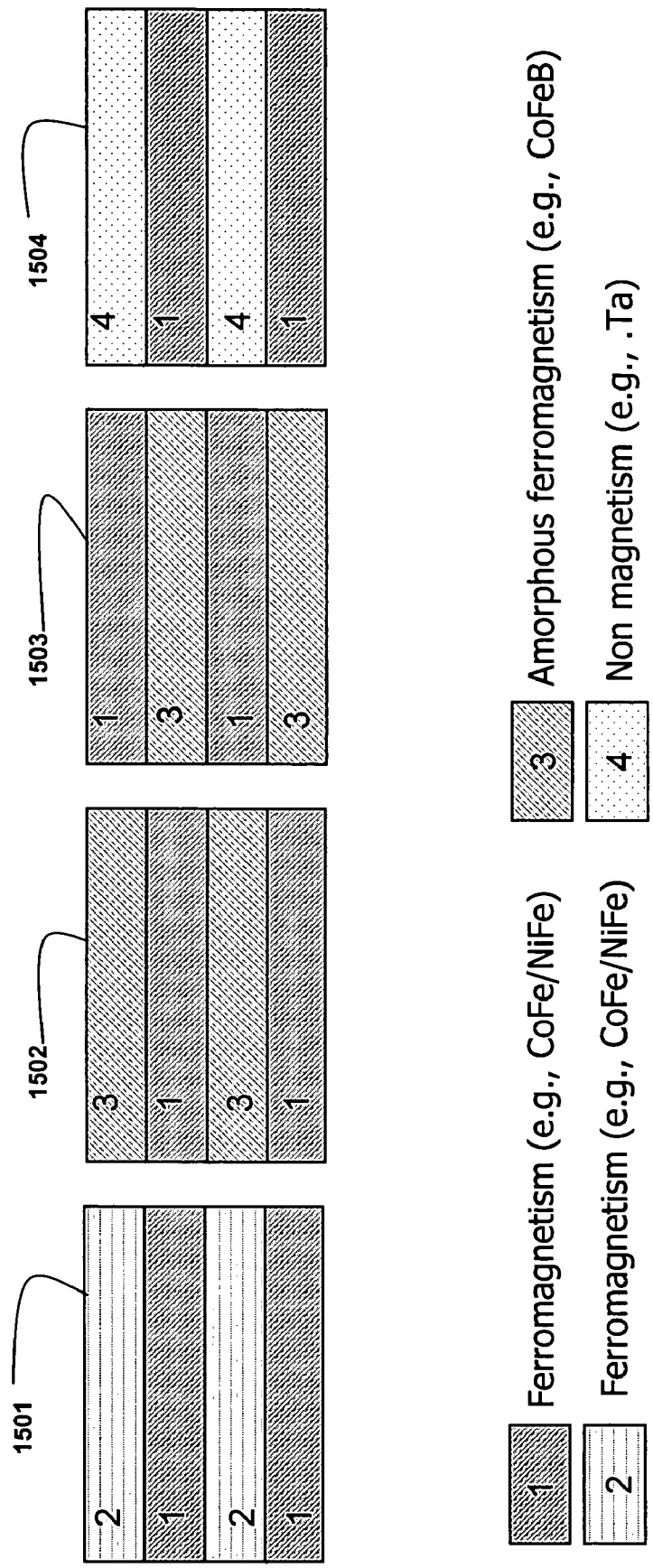
FIG. 15 illustrates schematic cross-sectional views of magnetic free layers according to alternative embodiments of the present invention.

The embodiments herein, including those of FIG. 15, are examples-only, and it should therefore be understood the scope of the present invention is to be construed by the appended claims, and not by the exemplary embodiments.

What is claimed is:

1. A magnetic tunnel junction device having a magnetically programmable free magnetic layer, said free magnetic layer comprising:
   a initial CoFe layer located over a semiconductor substrate;
   a stack of alternating NiFe and CoFe layers located on the initial CoFe layer, wherein a lowermost NiFe layer of the stack is located on the initial CoFe layer, and wherein the stack includes five NiFe layers and five CoFe layers; and
   a final NiFe layer located on an uppermost CoFe layer of the stack.

2. The device as claimed in claim 1, wherein the thickness of the initial CoFe and the thickness of the final NiFe is about 5 Å, the thickness of the each of the NiFe layers of the stack is about 5 Å and the thickness of the each of the CoFe layers of the stack is about 1 Å.

3. A magnetic tunnel junction device, comprising:
   a pinning layer on a semiconductor substrate;
   a pinned layer on the pinning layer;
   a tunnel barrier layer on the pinned layer; and a free layer comprising a initial CoFe layer located over a semiconductor substrate, a stack of alternating NiFe and CoFe layers located on the initial CoFe layer, and a final NiFe layer located on an uppermost CoFe layer of the stack, wherein a lowermost NiFe layer of the stack is located on the initial CoFe layer, and wherein the stack includes five NiFe layers and five CoFe layers.

4. The device as claimed in claim 3, wherein the thickness of the initial CoFe and the thickness of the final NiFe is about 5 Å, the thickness of the each of the NiFe layers of the stack is about 5 Å and the thickness of the each of the CoFe layers of the stack is about 1 Å.

5. A magnetic random access memory (MRAM) cell, comprising:
- an access transistor having a source region, a drain region and a word line across extending over a channel between the source region and the drain region;
- a lower electrode which is electrically connected with the drain region;
- an upper electrode located over the lower electrode;
- a bit line which is electrically connected with the upper electrode and located over the word line;
- a digit line which is parallel to the word line; and
- a magnetic tunneling junction device which is located between the lower electrode and the upper electrode and insulated from the digit line, wherein the magnetic tunneling junction device comprises a pinning layer, a pinned layer, a tunnel barrier layer, and a free layer;

wherein the tunnel barrier layer comprises a metal oxide, and wherein the free layer comprises a initial CoFe layer located over the lower electrode, a stack of alternating NiFe and CoFe layers located on the initial CoFe layer, and a final NiFe layer located on an uppermost CoFe layer of the stack, wherein a lowermost NiFe layer of the stack is located on the initial CoFe layer, and wherein the stack includes five NiFe layers and five CoFe layers.

6. The MRAM cell as claimed in claim 5, wherein the thickness of the initial CoFe and the thickness of the final NiFe is about 5 Å, the thickness of the each of the NiFe layers of the stack is about 5 Å and the thickness of the each of the CoFe layers of the stack is about 1 Å.

7. The MRAM cell as claimed in claim 5, wherein the pinning layer comprises an anti-ferromagnetic layer.

8. The MRAM cell as claimed in claim 5, wherein the pinned layer comprises a ferromagnetic layer.

* * * * *